US008642893B2

(12) United States Patent
 Higuchi (10) Patent No.: US 8,642,893 B2
(45) Date of Patent: Feb. 4, 2014

(54) COPPER FOIL FOR PRINTED CIRCUIT AND COPPER-CLAD LAMINATE

(75) Inventor: Naoki Higuchi, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 474 days.

(21) Appl. No.: 12/679,575

(22) PCT Filed: Sep. 12, 2008

(86) PCT No.: PCT/JP2008/066518
§ 371 (c)(1),
(2), (4) Date: Mar. 23, 2010

(87) PCT Pub. No.: WO2009/041292
PCT Pub. Date: Apr. 2, 2009

(65) Prior Publication Data
US 2010/0212941 A1    Aug. 26, 2010

(30) Foreign Application Priority Data

Sep. 28, 2007  (JP) ................................ 2007-254226

(51) Int. Cl.
*H05K 1/09*        (2006.01)
*H01B 5/00*        (2006.01)

(52) U.S. Cl.
USPC ........................................ 174/257; 174/126.2

(58) Field of Classification Search
USPC .......................................................... 174/257
See application file for complete search history.

(56) References Cited

U.S. PATENT DOCUMENTS

| | | | | |
|---|---|---|---|---|
| 5,019,944 A * | 5/1991 | Ishii et al. | ...................... | 361/783 |
| 6,419,811 B2 * | 7/2002 | Manabe et al. | ............... | 205/194 |
| 6,524,723 B2 * | 2/2003 | Hirose et al. | .................. | 428/607 |
| 6,638,642 B2 | 10/2003 | Kitano et al. | | |
| 6,835,241 B2 | 12/2004 | Tsuchida et al. | | |
| 6,960,391 B2 | 11/2005 | Natsume et al. | | |
| 7,341,796 B2 | 3/2008 | Hanafusa | | |
| 8,187,722 B2 * | 5/2012 | Nagatani et al. | ............... | 428/607 |
| 2002/0038790 A1 * | 4/2002 | Kurii et al. | ....................... | 216/13 |
| 2002/0182432 A1 | 12/2002 | Sakamoto et al. | | |
| 2004/0079456 A1 * | 4/2004 | Mandigo et al. | ............... | 148/554 |
| 2004/0161627 A1 * | 8/2004 | Yoshihara et al. | ............. | 428/607 |
| 2004/0209109 A1 | 10/2004 | Tsuchida et al. | | |
| 2009/0162685 A1 | 6/2009 | Kobayashi et al. | | |
| 2009/0208762 A1 | 8/2009 | Akase | | |
| 2010/0018273 A1 | 1/2010 | Sato | | |
| 2010/0040873 A1 | 2/2010 | Kohiki et al. | | |

FOREIGN PATENT DOCUMENTS

| | | |
|---|---|---|
| EP | 396056 A2 * | 11/1990 |
| GB | 1558919 | 1/1980 |
| JP | 04-096395 A | 3/1992 |
| JP | 09-087889 * | 3/1997 |
| JP | 09-087889 A | 3/1997 |
| JP | 09087889 A * | 3/1997 |

* cited by examiner

*Primary Examiner* — William H Mayo, III
*Assistant Examiner* — Rhadames J Alonzo Miller
(74) *Attorney, Agent, or Firm* — Howson & Howson LLP (57) ABSTRACT

A copper foil for a printed circuit having a roughened layer on a surface of a copper foil by way of copper-cobalt-nickel alloy plating, a cobalt-nickel alloy plated layer formed on the roughened layer, and a zinc-nickel alloy plated layer formed on the cobalt-nickel alloy plated layer, wherein the total amount of the zinc-nickel alloy plated layer is 150 to 500 pg/dm2, the lower limit of the nickel ratio in the alloy layer is 0.16, the upper limit thereof is 0.40, and the nickel content is 50 pg/dm2 or more.

20 Claims, 6 Drawing Sheets

| Coating Weight | Ni Ratio |
|---|---|
| 394 | 0.40 |

(B)

| Coating Weight | Ni Ratio |
|---|---|
| 344 | 0.34 |

(C)

| Coating Weight | Ni Ratio |
|---|---|
| 307 | 0.29 |

(D)

| Coating Weight | Ni Ratio |
|---|---|
| 314 | 0.24 |

COPPER FOIL FOR PRINTED CIRCUIT AND COPPER-CLAD LAMINATE

BACKGROUND OF THE INVENTION

The present invention relates to a copper foil for printed circuit and a copper-clad laminate, and in particular relates to a copper foil for printed circuit and a copper-clad laminate having alkali etching properties as well as favorable thermal peeling strength and thermal oxidation resistance as a result of performing roughening treatment on the surface of the copper foil by way of copper-cobalt-nickel alloy plating and thereafter forming a cobalt-nickel alloy plated layer and a zinc-nickel alloy plated layer. More specifically, the present invention relates to a copper foil for printed circuit and a copper-clad laminate capable of inhibiting the penetration of the etching solution into the base of the circuit when performing soft etching after forming the circuit. The copper foil of the present invention can be suitably applied, for example, to a fine pattern printed circuit and a magnetic head FPC (Flexible Printed Circuit).

Copper and copper alloy foil (hereinafter collectively referred to as "copper foil") has contributed significantly to the development of the electric/electronic industry and, in particular, is indispensible as a printed circuit material. A copper foil for printed circuit is generally prepared as follows. Specifically, copper foil is adhesively laminated to a base material such as a synthetic resin board or film using an adhesive or without using an adhesive under high temperature and pressure in order to produce a copper-clad laminate; and, in order to subsequently form the intended circuit, etching treatment is performed for eliminating the unwanted parts after the required circuit is printed via the processes of photoresist application and exposure.

Ultimately, the required element is soldered to form various types of printed-circuit boards for electronic devices. The quality demand for a copper foil for printed-circuit board differs between the surface (roughened surface) adherent to the resin base material and the nonadherent surface (glossy surface), and numerous methods have been proposed for both.

For example, main requirements of the roughened surface are as follows: (1) no oxidative discoloration during the storage thereof, (2) sufficient peeling intensity with the base material even after high-temperature heating, wet processing, soldering, chemical treatment and the like, and (3) no so-called stacking fault occurred after the lamination with the base material and etching.

Roughening treatment plays an important role in deciding the adhesiveness between the copper foil and the base material. As the roughening treatment, the copper roughening treatment of electrodepositing copper was initially adopted, but various other technologies have been proposed thereafter, and in particular copper-nickel roughening treatment has become one of the representative treatment methods for improving the thermal peeling strength, hydrochloric acid resistance and oxidation resistance.

The present applicant has proposed the copper-nickel roughening treatment (refer to Patent Document 1), and achieved results. The copper-nickel treated surface takes on a black color and, in particular, with a rolled foil for flexible substrate, the black color resulting from the copper-nickel treatment is acknowledged as the symbol of the product.

Nevertheless, while the copper-nickel roughening treatment is superior in terms of thermal peeling strength, oxidation resistance and hydrochloric acid resistance, it is difficult to perform etching with an alkali etching solution which is becoming important for fine pattern treatment in recent years, and the treated layer becomes etching residue during the formation of such a fine pattern that the circuit line width is 150 μm pitches or less.

Thus, as a fine pattern treatment method, the present application has previously developed the Cu—Co treatment (refer to Patent Document 2 and Patent Document 3) and the Cu—Co—Ni treatment (refer to Patent Document 4). These roughening treatments yield favorable etching properties, alkali etching properties and hydrochloric acid resistance, but it was once again discovered that the thermal peeling strength would deteriorate when an acrylic adhesive is used, the oxidation resistance was also insufficient, and the color was brown to umber brown and does not reach black.

Pursuant to the trend of finer patterns and diversification of printed circuits in recent years, the following are being demanded; namely, 1) to possess thermal peeling strength (particularly when using an acrylic adhesive) and hydrochloric acid resistance that are comparable to cases of performing Cu—Ni treatment, 2) to be able to etch a printed circuit having a circuit line width of 150 μm pitches or less with an alkali etching solution, 3) to improve the oxidation resistance (oxidation resistance in an oven at 180° C.×30 minutes) as in the case of Cu—Ni treatment, and 4) to achieve blackening treatment as in the case of Cu—Ni treatment.

In other words, the finer circuit develops a strong tendency of the circuit to peel off due to the hydrochloric acid etching solution, and it is necessary to prevent such peeling of the circuit. When the circuit becomes finer, the circuit tends to peel off due to high temperatures caused by soldering and other treatments, and it is also necessary to prevent such peeling of the circuit. In increasingly finer patters; for instance, it is an essential requirement to be able to etch a printed circuit having a circuit line width of 150 μm pitches or less with a $CuCl_2$ etching solution, and alkali etching is also becoming an essential requirement pursuant to the diversification of the photoresist and the like. A black surface is also becoming important for the manufacture of copper foils and from the perspective of chip mounts in order to improve the positioning accuracy and thermal absorption.

In response to the foregoing demands, the present applicant succeeded in developing a copper foil treatment method in order to obtain, as a result of performing roughening treatment on the surface of the copper foil by way of copper-cobalt-nickel alloy plating and thereafter forming a cobalt plated layer or a cobalt-nickel alloy plated layer, a copper foil for printed circuit that: comprises many of the general characteristics described above, particularly the various characteristics described above as in the case of Cu—Ni treatment; does not reduce the thermal peeling strength even when using an acrylic adhesive; and has superior oxidation resistance and a surface color that is black (refer to Patent Document 5).

Preferably, after forming the cobalt plated layer or the cobalt-nickel alloy plated layer, rust-proof treatment as represented with a single coating (metal coating) of chrome oxide or a composite coating (alloy coating) of chrome oxide, and zinc and/or zinc oxide is performed.

Subsequently, with the development of electronic equipment, the miniaturization and high integration of semiconductor devices advanced even further. Accordingly, the adhesive strength between the copper foil and the resin base material decreases because the treatments performed during the manufacture of these printed circuits are based on even higher temperatures and heat is generated during the use of devices after productization, and it has been a problem.

In light of the above, in the treatment method of a copper foil for printed circuit established in Patent Document 5 in which roughening treatment is performed to the surface of a copper foil by way of copper-cobalt-nickel alloy plating and thereafter a cobalt plated layer or a cobalt-nickel alloy plated layer is formed; the present applicant devised an invention for further improving the thermal peeling resistance when forming a cobalt-nickel alloy plated layer having better thermal deterioration resistance than a cobalt plated layer after the roughening treatment.

This is a treatment method of a copper foil for printed circuit, in which a cobalt-nickel alloy plated layer is formed after a roughening treatment on the surface of a copper foil by way of copper-cobalt-nickel alloy plating, and additionally a zinc-nickel alloy plated layer is formed. This is an extremely effective invention and is one of the major products of present-day copper foil circuit materials.

The present invention is a further improvement of the foregoing copper foil circuit material. A copper foil circuit is becoming even finer as described above, and the process of soft etching using an etching solution containing sulfuric acid and hydrogen peroxide on the surface of copper circuit after once forming the circuit on the substrate is being performed. During this process, a problem of penetration of the etching solution into the edge part of the adhesive site between a resin substrate of polyimide or the like and copper foil has occurred.

To put it differently, a part of the treatment surface of the copper foil is being corroded. This kind of corrosion will deteriorate the adhesive strength between the copper foil and the resin in a fine circuit, and is a major problem. Thus, a solution to this problem is required.

[Patent Document 1] Publication of Japanese Unexamined Patent Application No. S52-145769
[Patent Document 2] Publication of Japanese Examined Patent Application No. S63-2158
[Patent Document 3] Japanese Patent Application No. H1-112227
[Patent Document 4] Japanese Patent Application No. H1-112226
[Patent Document 5] Publication of Japanese Examined Patent Application No. H6-54831
[Patent Document 6] Japanese Patent No. 2849059

SUMMARY OF THE INVENTION

With the development of electronic equipment, the miniaturization and high integration of semiconductor devices advanced even further. Accordingly, the adhesive strength between the copper foil and the resin base material decreases because the treatments performed during the manufacture of these printed circuits are based on even higher temperatures and heat is generated during the use of electronic equipment after the productization, and it has been a problem. Thus, an object of this invention is to further improve the copper foil for printed circuit established in the patent (Patent Document 6) by the present applicant, and to provide technology for preventing the penetration into the circuit edge part when performing the soft etching of the copper foil circuit. It is also important to simultaneously maintain the conventional characteristics. In light of the above, the ensuing explanation is based on the foregoing effective patent.

The present invention provides:

1) A copper foil for printed circuit comprising a roughened layer on a surface of a copper foil by way of copper-cobalt-nickel alloy plating, a cobalt-nickel alloy plated layer formed on the roughened layer, and a zinc-nickel alloy plated layer formed on the cobalt-nickel alloy plated layer; the copper foil for printed circuit comprising a zinc-nickel alloy plated layer in which the total amount of the zinc-nickel alloy plated layer is within the range of 150 to 500 $\mu g/dm^2$, the nickel content is within the range of 50 $\mu g/dm^2$ or more, and the nickel ratio is within the range of 0.16 to 0.40;

2) The copper foil for printed circuit according to the above 1), wherein the penetrated amount into the edge part of the copper foil circuit is 9 $\mu$m or less when performing soft etching with an etching aqueous solution containing 10 wt % of $H_2SO_4$ and 2 wt % of $H_2O_2$ to a copper foil circuit formed on a substrate by using the copper foil for printed circuit;

3) The copper foil for printed circuit according to the above 2), wherein the penetrated amount is 5 $\mu$m or less;

4) The copper foil for printed circuit according to any one of the above 1) to 3) further comprising a rust-proof layer on the zinc-nickel alloy plated layer;

5) The copper foil for printed circuit according to any one of the above 1) to 4), wherein the rust-proof treatment is to provide a single coating (metal coating) layer of chrome oxide or a composite coating (alloy coating) layer of chrome oxide, and zinc and/or zinc oxide;

6) The copper foil for printed circuit according to any one of the above 1) to 5) further comprising a silane coupling layer on the composite coating layer;

7) The copper foil for printed circuit according to any one of the above 1) to 6) comprising a roughened layer on the surface of the copper foil by way of copper-cobalt-nickel alloy plating, wherein each deposited mass at the roughened layer is copper: 15 to 40 $\mu g/dm^2$, cobalt: 100 to 3000 $\mu g/dm^2$ and nickel: 100 to 500 $\mu g/dm^2$;

8) The copper foil for printed circuit according to any one of the above 1) to 7), wherein the cobalt-nickel alloy plated layer has a deposited mass of cobalt within a range of 200 to 3000 $\mu g/dm^2$ and a cobalt ratio of 60 to 66 mass %; and 9) A copper-clad laminate obtained by bonding the copper foil for printed circuit according to any one of the above 1) to 8) to a resin substrate by way of thermocompression without using an adhesive.

With the development of electronic equipment, the miniaturization and high integration of semiconductor devices have advanced further. This tendency has led to a demand for the adoption of a higher temperature in treatment in a production process of printed circuits and has led to heat generation during the use of electronic equipment after the productization. The present invention provides such superior effects that, even under these circumstances, the adhesive strength between a copper foil and a resin base material does not decrease and the penetration into a circuit edge part can be effectively prevented when performing the soft etching of a copper foil circuit.

BRIEF DESCRIPTION OF THE DRAWINGS

[FIG. 3] A diagram showing the evaluation result of penetration in relation to the zinc-nickel alloy coating weight and the nickel ratio. "x" shows a case where the penetrated amount is large, and "○" shows a case where the penetrated amount is small. In FIG. 3, the upper right range of the straight line connecting A-B-C-D-E-F shows a range where the penetrated amount is small, provided that the upper limit of the total coating weight is 500 µg/dm² and the upper limit of the Ni ratio is 0.40.

DETAILED DESCRIPTION OF THE INVENTION

As the copper foil of the present invention, both an electrolytic copper foil and a rolled copper foil can be used. Normally, in order to increase the peeling intensity of the copper foil after the lamination, the degreased surface of copper foil, namely the surface adherent to the resin base material (the surface to be roughened), is subject to roughening treatment in which electrodeposition is performed to make the surface nubbly. The electrolytic copper foil possesses asperity at the time of manufacture, and the convex part of the electrolytic copper foil is reinforced and the asperity is enlarged further by way of the roughening treatment.

In the present invention, the roughening treatment is performed by way of copper-cobalt-nickel alloy plating. The preprocessing such as ordinary plating of copper is sometimes performed before the roughening treatment, and the finishing process such as ordinary plating of copper is sometimes performed after the roughening treatment in order to prevent the loss of the electrodeposits.

The treatment may differ slightly with the rolled copper foil and the electrolytic copper foil. In the present invention, the foregoing preprocessing and finishing process as well as other publicly known processes related to the roughening of the copper foil are hereinafter collectively referred to as the "roughening treatment" as appropriate.

The copper-cobalt-nickel alloy plating is implemented as the roughening treatment in the present invention by way of electrolytic plating so as to form a ternary system alloy layer in which each deposited mass is copper: 15 to 40 mg/dm², cobalt: 100 to 3000 µg/dm² and nickel: 100 to 500 µg/dm². If the deposited mass of Co is less than 100 µg/dm², the thermal resistance will become inferior and the etching properties will also become inferior. If the deposited mass of Co exceeds 3000 µg/dm², this is not preferable in cases where it is necessary to give consideration to the influence of magnetic properties, etching stain will occur, and the acid resistance and chemical resistance may deteriorate.

If the deposited mass of Ni is less than 100 µg/dm², the thermal resistance will become inferior. Meanwhile, if the deposited mass of Ni exceeds 500 µg/dm², the etching properties will deteriorate. Specifically, etching residue will remain and, although this is not at a level where etching cannot be performed, it will be difficult to obtain a fine pattern. The preferable deposited mass of Co is 2000 to 3000 µg/dm², and the preferable deposited mass of nickel is 200 to 400 µg/dm².

Here, an etching stain means that Co remains without being dissolved when etching is performed using copper chloride, and an etching residue means that Ni remains without being dissolved when alkali etching is performed using ammonium chloride.

Generally speaking, when forming a circuit, an alkali etching solution and an etching solution of copper chloride system as explained in the following Examples are used. The etching solutions and etching conditions have broad utility, and are not limited to the following conditions, and it should be understood that the etching solutions and etching conditions may be arbitrarily selected.

The general bath and plating conditions for forming the foregoing ternary system copper-cobalt-nickel alloy plating are as follows.
(Copper-Cobalt-Nickel Alloy Plating)
Cu: 10 to 20 g/liter
Co: 1 to 10 g/liter
Ni: 1 to 10 g/liter
pH: 1 to 4
Temperature: 30 to 50° C.
Current density $D_k$: 20 to 50 A/dm²
Time: 1 to 5 seconds With the present invention, after the roughening treatment, a cobalt-nickel alloy plated layer is formed on the roughened surface. This cobalt-nickel alloy plated layer has a deposited mass of cobalt within a range of 200 to 3000 µg/dm² and a cobalt ratio of 60 to 66 mass %. This treatment, in a broad sense, can be thought as one type of rust-proof treatment.

The cobalt-nickel alloy plated layer needs to be formed at a level where the adhesive strength between the copper foil and the substrate will not substantially deteriorate. If the deposited mass of cobalt is less than 200 µg/dm², the thermal peeling strength will deteriorate, and the oxidation resistance and chemical resistance will become inferior. As another reason, the treated surface will become a reddish color, and this is undesirable.

If the deposited mass of cobalt exceeds 3000 µg/dm², this is not preferable in cases where it is necessary to give consideration to the influence of magnetic properties, etching stain will occur, and the acid resistance and chemical resistance may deteriorate. Thus, the preferable deposited mass of cobalt is 500 to 3000 µg/dm².

Moreover, if the deposited mass of cobalt is large, there are cases where it may cause the penetration of soft etching. In light of the above, the cobalt ratio is desirably 60 to 66 mass %. As described later, the primary and direct cause of the penetration caused by the soft etching is the heat and rust proof layer configured from the zinc-nickel alloy plated layer. However, since cobalt also causes the penetration during the soft etching in certain cases, the foregoing adjustment would be a more desirable condition.

Meanwhile, if the deposited mass of nickel is small, the thermal peeling strength will deteriorate, and the oxidation resistance and chemical resistance will also deteriorate. If the deposited mass of nickel is excessive, the alkali etching properties will become inferior, and it is desirable to be decided by reflecting the balance with the foregoing cobalt content.

Conditions of the cobalt-nickel alloy plating are as follows.
(Cobalt-Nickel Alloy Plating)
Co: 1 to 20 g/liter
Ni: 1 to 20 g/liter
pH: 1.5 to 3.5
Temperature: 30 to 80° C.
Current density $D_k$: 1.0 to 20.0 A/dm²
Time: 0.5 to 4 seconds With the present invention, a zinc-nickel alloy plated layer is additionally formed on the cobalt-nickel alloy plating, and the total amount of the zinc-nickel alloy plated layer is set to 150 to 500 µg/dm², and the nickel ratio is set to 16 to 40 mass %. This plays an important role as a heat and rust proof layer.

The treatments performed during the manufacture of these printed circuits are based on even higher temperatures, and heat is generated during the use of devices after productization. For example, with a so-called bilayer material in which copper foil is bonded to resin by way of thermocompression, it is subject to heat of 300° C. or higher during the bonding process. Even under these circumstances, it is necessary to prevent the deterioration in the adhesive strength between the copper foil and the resin base material.

Figure 1:
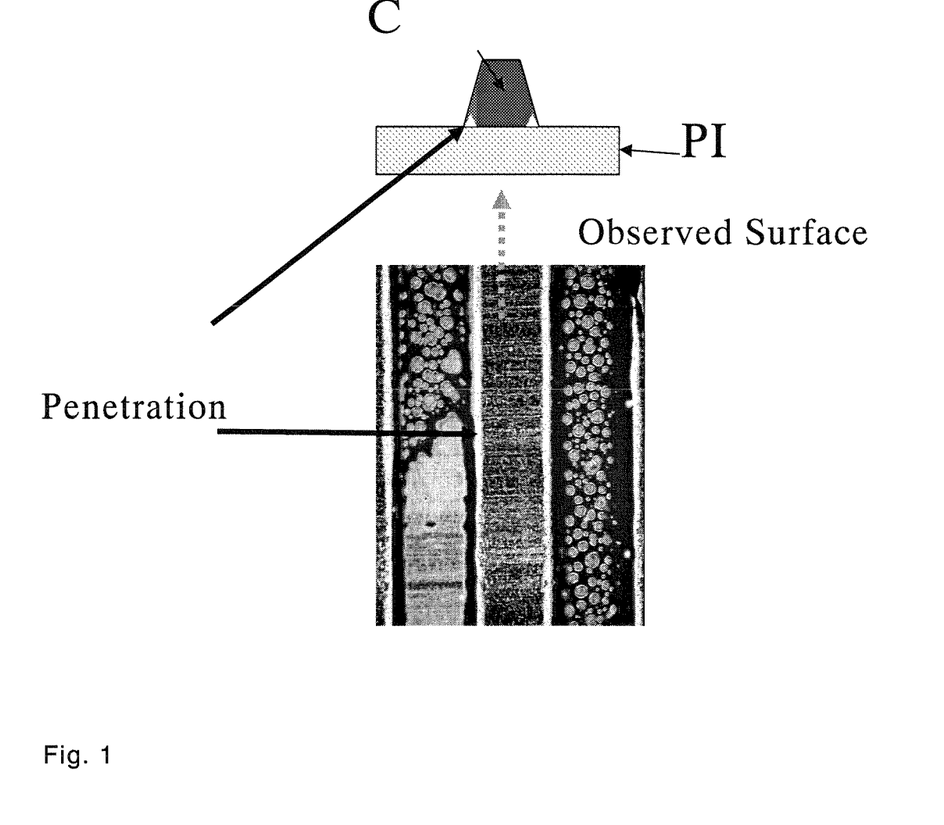
[FIG. 1] A frame format explaining the penetration into the circuit when performing soft etching treatment to the copper foil circuit.

Moreover, with conventional technology, when a fine circuit comprising a zinc-nickel alloy plated layer in the bilayer material obtained by bonding copper foil to resin by way of thermocompression was subject to soft etching, discoloration due to the penetration at the circuit edge part was occurred. This is shown in FIG. 1. The cause of penetration at the circuit was considered to be zinc. In light of the above, to increase the amount of zinc in the zinc-nickel alloy plated layer was unimaginable.

However, upon investigating the cause, since a bilayer material obtained by bonding copper foil to resin by way of thermocompression is subject to heat of 300° C. or higher, a phenomenon that zinc in the zinc-nickel alloy plated layer of the copper foil diffuses into the copper layer has been seen. This inevitably results in the decrease of zinc in the zinc-nickel alloy plated layer and the increase of the nickel ratio. Nickel is effective in inhibiting the penetration of the etchant (etching aqueous solution containing 10 wt % of $H_2SO_4$ and 2 wt % of $H_2O_2$) that is used for the soft etching.

In light of the above, the present inventors discovered that it is possible to maintain the role of the heat and rust proof layer of the zinc-nickel alloy plated layer and inhibit the penetration of the etchant that is used for the soft etching by increasing the zinc content in the zinc-nickel alloy plated layer corresponding to the amount of zinc consumed due to the diffusion; that is, increasing the total amount of the zinc-nickel alloy plated layer and maintaining the nickel content in the zinc-nickel alloy plated layer at a predetermined amount. The present invention is a new discovery that was not available conventionally, and is an effective invention that focused attention on the foregoing points.

As described above, if the total amount of the zinc-nickel alloy plated layer is 150 to 500 $\mu g/dm^2$, the lower limit of the nickel ratio in the alloy layer is 0.16, the upper limit thereof is 0.40, and the nickel content is 50 $\mu g/dm^2$ or more; it is possible to comprise the important role of the heat and rust proof layer, inhibit the penetration of the etchant that is used for the soft etching, and prevent the weakening of the adhesive strength of the circuit caused by corrosion. These conditions are the basis of the present invention.

Here, if the total amount of the zinc-nickel alloy plated layer is less than 150 $\mu g/dm^2$, the heat and rust resistance will deteriorate and it will not be possible to fulfill the role as a heat and rust proof layer. Meanwhile, if the total amount exceeds 500 $\mu g/dm^2$, the hydrochloric acid resistance will deteriorate.

Moreover, if the lower limit of the nickel ratio in the alloy layer is less than 0.16, this is not preferable since the penetrated amount during the soft etching will exceed 9 $\mu m$. The upper limit of the nickel ratio at 0.40 is the limit in technology to form the zinc-nickel alloy plated layer, and is an inevitable numerical value.

Figure 3:
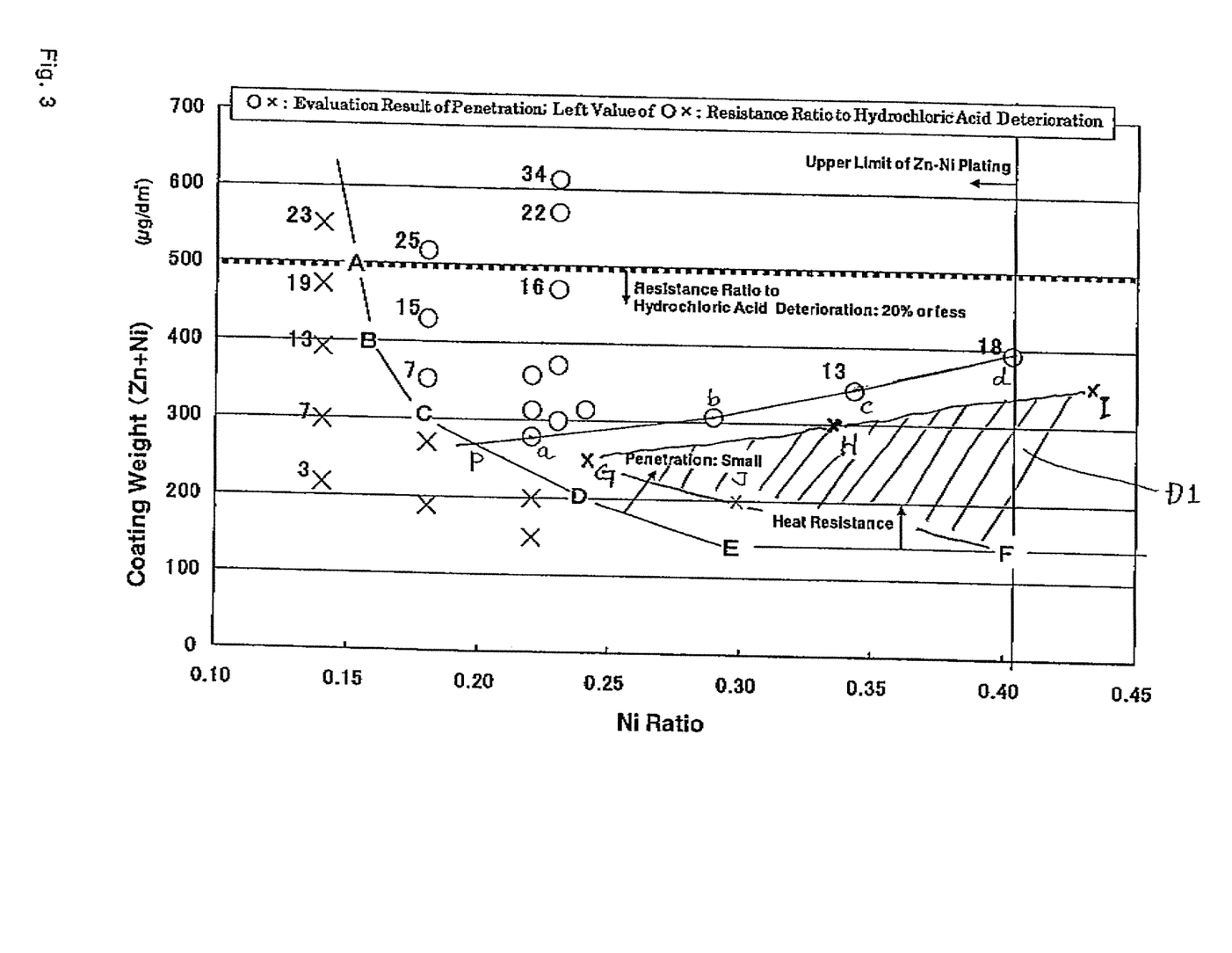

Moreover, with the copper foil for printed circuit comprising a roughened layer on a surface of a copper foil by way of copper-cobalt-nickel alloy plating, a cobalt-nickel alloy plated layer formed on the roughened layer, and a zinc-nickel alloy plated layer formed on the cobalt-nickel alloy plated layer; the copper foil of the present invention comprises a zinc-nickel alloy plated layer, in which the total amount of the zinc-nickel alloy plated layer is within the range of 150 to 500 $\mu g/dm^2$, and the nickel ratio is within the range of 0.16 to 0.40, and which, in FIG. 3 as the relationship diagram between the nickel ratio and the total coating weight, falls within the upper right range of the line shown in FIG. 3 respectively connecting the point A in which the nickel ratio is 0.16 when the total amount of the zinc-nickel alloy plated layer is 500 $\mu g/dm^2$, the point B in which the nickel ratio is 0.17 when the foregoing total amount is 400 $\mu g/dm^2$, the point C in which the nickel ratio is 0.18 when the foregoing total amount is 300 $\mu g/dm^2$, the point D in which the nickel ratio is 0.24 when the foregoing total amount is 200 $\mu g/dm^2$, the point E in which the nickel ratio is 0.30 when the foregoing total amount is 150 $\mu g/dm^2$, and the point F in which the nickel ratio is 0.40 when the foregoing total amount is 150 $\mu g/dm^2$.

It is thereby possible to keep the penetrated amount into the edge part of copper foil circuit at 9 $\mu m$ or less when performing soft etching to the copper foil circuit formed on a substrate using the foregoing copper foil for printed circuit, and this will yield sufficient functions as the copper foil for printed circuit.

Needless to say, although it would be most ideal that no penetration is occurred, it would be particularly effective if the penetrated amount is 5 $\mu m$ or less as a matter of course. The copper foil for printed circuit according to the present invention covers all of the foregoing aspects.

Conditions of the zinc-nickel alloy plating are as follows.
(Zinc-Nickel Alloy Plating)
Zn: 0 to 30 g/liter
Ni: 0 to 25 g/liter
pH: 3 to 4
Temperature: 40 to 50° C.
Current density $D_k$: 0.5 to 5 $A/dm^2$
Time: 1 to 3 seconds As described above, in the present invention, the copper-cobalt-nickel alloy plated layer as the roughening treatment, and then the cobalt-nickel alloy plated layer and the zinc-nickel alloy plated layer are sequentially formed. It is also possible to adjust the total deposited mass of cobalt and the total deposited mass of nickel in the foregoing layers. Preferably, the total deposited mass of cobalt is 300 to 5000 $\mu g/dm^2$, and the total deposited mass of nickel us 260 to 1200 $\mu g/dm^2$.

If the total deposited mass of cobalt is less than 300 $\mu g/dm^2$, the heat resistance and chemical resistance will deteriorate. If the total deposited mass of cobalt exceeds 5000 $\mu g/dm^2$, an etching stain may occur. Moreover, if the total deposited mass of nickel is less than 260 $\mu g/dm^2$, the heat resistance and chemical resistance will deteriorate. If the total deposited mass of nickel exceeds 1200 $\mu g/dm^2$, an etching residue will occur. Preferably, the total deposited mass of cobalt is 2500 to 5000 $\mu g/dm^2$, and the total deposited mass of nickel is 580 to 1200 $\mu g/dm^2$, and more preferably 600 to 1000 $\mu g/dm^2$. However, so as long as the foregoing conditions are satisfied, there is no need to be restricted to the conditions provided in this paragraph.

Rust-proof treatment is subsequently performed as needed. The preferred rust-proof treatment in the present invention is a single coating (metal coating) of chrome oxide or a composite coating (alloy coating) of chrome oxide and zinc/zinc oxide. A composite coating of chrome oxide and zinc/zinc oxide is the treatment to coat a rust-proof layer of a composite of zinc-chrome group formed from zinc or zinc oxide and chrome oxide by electroplating with a plating bath containing zinc salt or zinc oxide and chromate.

An representative example of the plating bath is a mixed aqueous solution containing: at least one type among bichromate such as $K_2Cr_2O_7$ and $Na_2Cr_2O_7$, and $CrO_3$ or the like; at least one type of soluble zinc salt such as ZnO and $ZnSO_4 \cdot 7H_2O$; and alkali hydroxide. The representative plating bath composition and electrolytic conditions are as follows.

(Chrome Rust-Proof Treatment)

$K_2Cr_2O_7$ ($Na_2Cr_2O_7$ or $CrO_3$): 2 to 10 g/liter
NaOH or KOH: 10 to 50 g/liter
ZnO or $ZnSO_4 \cdot 7H_2O$: 0.05 to 10 g/liter
pH: 3 to 13
Bath temperature: 20 to 80° C.
Current density $D_k$: 0.05 to 5 A/dm$^2$
Time: 5 to 30 seconds
Anode: Pt—Ti plate, stainless steel plate, etc.

With the chrome oxide, a chrome content of 15 μg/dm$^2$ or more and a zinc content of 30 μg/dm$^2$ or more are required as the coating weight.

The obtained copper foil possesses superior thermal peeling strength, oxidation resistance and hydrochloric acid resistance. Moreover, the printed circuit having a circuit line width of 150 μm pitches or less can be etched using a $CuCl_2$ etching solution, and alkali etching is also possible. Moreover, it is possible to inhibit the penetration to the circuit edge part during the soft etching process.

As the soft etching solution, an aqueous solution containing 10 wt % of $H_2SO_4$ and 2 wt % of $H_2O_2$ may be used. The treatment time and temperature can be arbitrarily adjusted.

As the alkali etching solution, for example, a solution of $NH_4OH$: 6 moles/liter, $NH_4Cl$: 5 moles/liter, $CuCl_2$: 2 moles/liter (temperature of 50° C.) and the like can be used.

The obtained copper foil has the same black color as in the case of Cu—Ni treatment. The black color is significant because the positioning accuracy and thermal absorption are high. For example, a printed-circuit substrate, whether it is a rigid substrate or a flexible substrate, is mounted with an IC, resistor, condenser and other components based on an automated process, and the chip mount is performed while reading the circuit with a sensor during the foregoing process. Here, positioning is sometimes performed at the treatment surface of copper foil via a kapton film or the like. Moreover, the same applies to the positioning upon forming a through-hole. The blacker the treatment surface in the foregoing case, the better the absorption of light. The positioning accuracy will therefore improve. In addition, when preparing a substrate, the copper foil and film are often bonded by way of curing while applying heat thereto. Here, when long waves of far infrared rays or infrared rays are used for the heating process, the heating efficiency will improve if the color of the treatment surface is blacker.

Finally, as needed, silane treatment of applying a silane coupling agent on at least the roughened surface of the rust-proof layer is performed primarily to improve the adhesiveness between the copper foil and the resin substrate. As the silane coupling agent to be used in the foregoing silane treatment, olefin-type silane, epoxy-type silane, acrylic-type silane, amino-type silane, mercapto-type silane and the like may be considered, and these may be suitably selected and used.

As the application method, spraying of a silane coupling agent solution, application with a coater, immersion coating, flow coating or the like may be used. For example, Publication of Japanese Examined Application No. S60-15654 describes that the adhesiveness between the copper foil and resin substrate improves by performing chromate treatment to the roughened surface side of the copper foil, and thereafter performing silane coupling agent treatment. Please refer to the document for details. Subsequently, as needed, annealing treatment is sometimes performed for the purpose of improving the ductility of the copper foil.

EXAMPLES

The Examples and Comparative Examples of the present invention are now explained. These Examples are merely illustrative, and the present invention shall in no way be limited thereby. In other words, various modifications and other embodiments based on the technical spirit claimed in the claims shall be included in the present invention as a matter of course.

After performing roughening treatment to a rolled copper foil by way of copper-cobalt-nickel alloy plating within the range of the following conditions and adhering 17 mg/dm$^2$ of copper, 2000 μg/dm$^2$ of cobalt and 500 μg/dm$^2$ of nickel, this was water washed, and a cobalt-nickel alloy plated layer was formed thereon. Here, the deposited mass of cobalt was 800 to 1400 μg/dm$^2$, and the deposited mass of nickel was 400 to 600 μg/dm$^2$.

The bath composition and plating conditions used here were as follows.

[Bath Composition and Plating Conditions]
(A) Roughening Treatment (Cu—Co—Ni Alloy Plating)
Cu: 15 g/liter
Co: 8.5 g/liter
Ni: 8.6 g/liter
pH: 2.5
Temperature: 38° C.
Current density $D_k$: 20 A/dm$^2$
Time: 2 seconds
Deposited mass of copper: 17 mg/dm$^2$
Deposited mass of cobalt: 2000 μg/dm$^2$
Deposited mass of nickel: 500 μg/dm$^2$ (B) Rust-Proof Treatment (Co—Ni Alloy Plating)
Co: 4 to 7 g/liter
Ni: 10 g/liter
pH: 2.5
Temperature: 50° C.
Current density $D_k$: 8.9 to 13.3 A/dm$^2$
Time: 0.5 seconds
Deposited mass of cobalt: 800 to 1400 μg/dm$^2$
Deposited mass of nickel: 400 to 600 μg/dm$^2$ After water washing, a zinc-nickel alloy plated layer was formed on the cobalt-nickel alloy plated layer.

(C) Heat and Rust Proof Layer (Zn—Ni Alloy Plating)
Zn ion concentration: 2 to 11 g/liter
Ni ion concentration: 15 to 25 g/liter
pH: 3.5
Temperature: 40° C.
Current density $D_k$: 0 to 15 A/dm$^2$
Time: 0.3 to 2 seconds The plating bath composition of the foregoing Zn—Ni alloy was used to subsequently form a Zn—Ni alloy plating on the cobalt-nickel alloy plated layer. Rust-proof treatment was ultimately performed, and it was then dried.

(When the Ni Ratio in the Plating of the Zn—Ni Alloy is Set to 0.23)

Example 1

Deposited mass of Zn—Ni alloy: 300 μg/dm$^2$, Ni ratio: 0.23, provided that the Ni content is 69 μg/dm$^2$ Example 2

Deposited mass of Zn—Ni alloy: 371 μg/dm$^2$, Ni ratio: 0.23, provided that the Ni content is 85 μg/dm$^2$

Example 3

Deposited mass of Zn—Ni alloy: 470 μg/dm², Ni ratio: 0.23, provided that the Ni content is 108 μg/dm²

Example 4

Deposited mass of Zn—Ni alloy: 569 μg/dm², Ni Ratio: 0.23, provided that the Ni content is 131 μg/dm²

Example 5

Deposited mass of Zn—Ni alloy: 613 μg/dm², Ni Ratio: 0.23, provided that the Ni content is 141 μg/dm²

Comparative Examples 1 and 2

(When the Ni ratio in the plating of the Zn—Ni alloy is set to 0.18)

Comparative Example 1

Deposited mass of Zn—Ni alloy: 189 μg/dm², Ni ratio: 0.18, provided that the Ni content is 34 μg/dm²

Comparative Example 2

Deposited mass of Zn—Ni alloy: 271 μg/dm², Ni ratio: 0.18, provided that the Ni content is 49 μg/dm²

Examples 6 to 8

Example 6

Deposited mass of Zn—Ni alloy: 352 μg/dm², Ni ratio: 0.18, provided that the Ni content is 63 μg/dm²

Example 7

Deposited mass of Zn—Ni alloy: 429 μg/dm², Ni ratio: 0.18, provided that the Ni content is 77 μg/dm²

Example 8

Deposited mass of Zn—Ni alloy: 517 μg/dm², Ni ratio: 0.18, provided that the Ni content is 93 μg/dm²

Comparative Examples 3 to 7

(When the Ni Ratio in the Plating of the Zn—Ni Alloy is Set to 0.14)

Comparative Example 3

Deposited mass of Zn—Ni alloy: 217 μg/dm², Ni ratio: 0.14, provided that the Ni content is 30 μg/dm²

Comparative Example 4

Deposited mass of Zn—Ni alloy: 298 μg/dm², Ni ratio: 0.14, provided that the Ni content is 42 μg/dm²

Comparative Example 5

Deposited mass of Zn—Ni alloy: 392 μg/dm², Ni ratio: 0.14, provided that the Ni content is 55 μg/dm²

Comparative Example 6

Deposited mass of Zn—Ni alloy: 473 μg/dm², Ni ratio: 0.14, provided that the Ni content is 66 μg/dm²

Comparative Example 7

Deposited mass of Zn—Ni alloy: 550 μg/dm², Ni ratio: 0.14, provided that the Ni content is 77 μg/dm²

(D) Rust-Proof Treatment (Chromate)

$K_2Cr_2O_7$ ($Na_2Cr_2O_7$ or $CrO_3$): 5 g/liter
NaOH or KOH: 30 g/liter
ZnO or $ZnSO_4 \cdot 7H_2O$: 5 g/liter
pH: 10
Temperature: 40° C.
Current density $D_k$: 2 A/dm²
Time: 10 seconds
Anode: Pt—Ti plate Polyamic acid varnish (Varnish A manufactured by Ube Industries, Ltd.) was applied to the copper foil produced as described above, and bonded to a polyimide film having a thickness of 20 μm by way of thermocompression at 310° C. The thermocompression bonding process was entirely performed in the atmosphere. Subsequently, the copper foil was used to form a circuit with the following etching solution.

(Alkali Etching Solution)

$NH_4OH$: 6 moles/liter
$NH_4Cl$: 5 moles/liter
$CuCl_2 \cdot 2H_2O$: 2 moles/liter
Temperature: 50° C.

The etching stain was visually observed by using the following copper chloride-hydrochloric acid solution and observing the etching state.

(Copper Chloride Etching Solution)

$CuCl_2 \cdot 2H_2O$: 200 g/liter
HCl: 150 g/liter
Temperature: 40° C.

The formed copper circuit was further subject to soft etching for 5 minutes using an etching aqueous solution containing 10 wt % of $H_2SO_4$ and 2 wt % of $H_2O_2$.

The penetration in the foregoing case was observed using an optical microscope from the back face of the polyimide. Since polyimide is thin and permeable, penetration can be observed from the back face of the polyimide.

Figure 2:
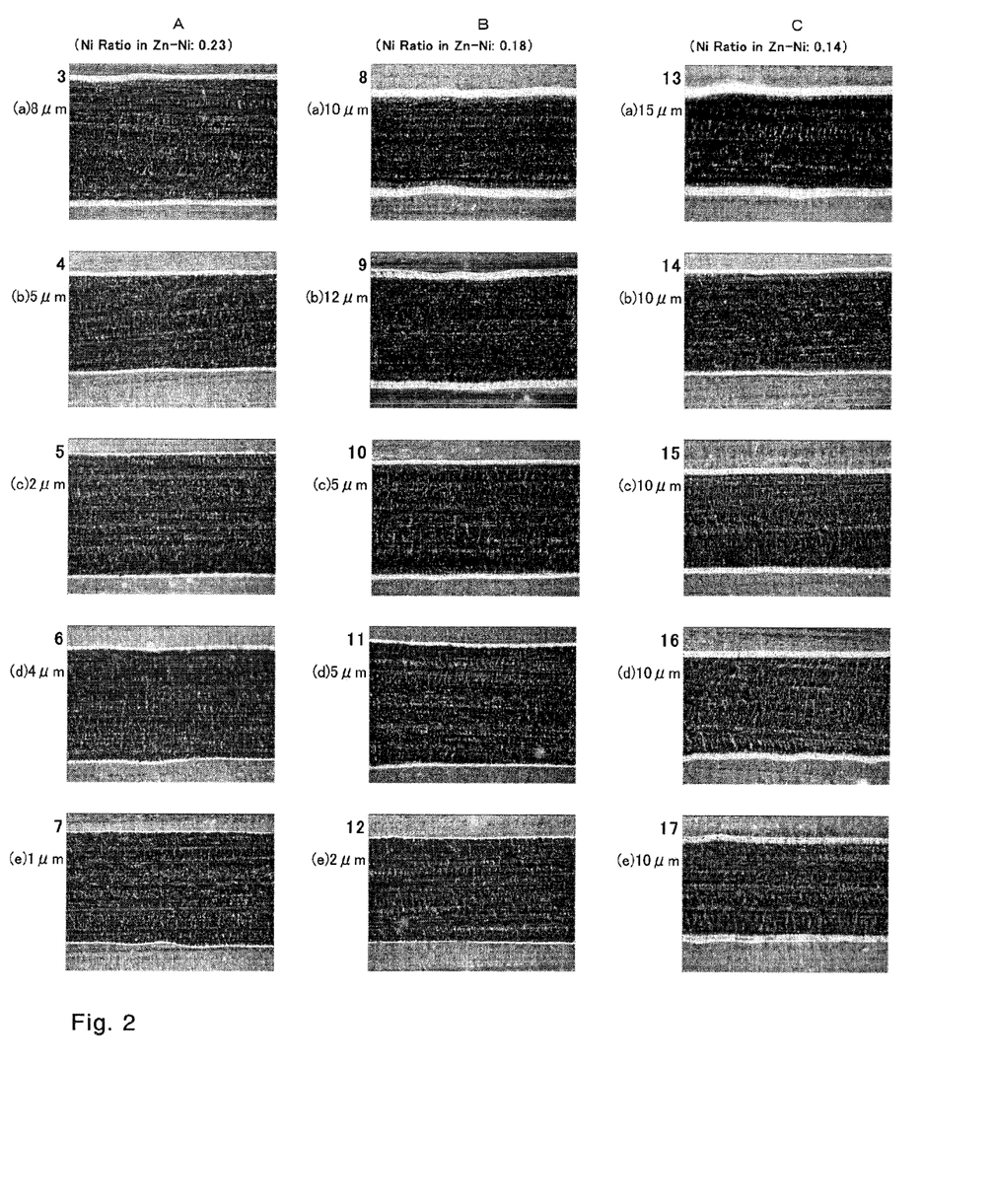
[FIG. 2] A diagram showing the results of observation on the penetrated amount in the circuit of copper-clad laminates prepared under the conditions of Examples 1 to 8 and Comparative Examples 1 to 7.

The results are shown in FIG. 2. As shown in FIG. 2, Examples 1 to 5 correspond to (a) to (e) of FIG. 2A. Penetration of 8 μm was observed in Example 1, penetration of 5 μm was observed in Example 2, penetration of 2 μm was observed in Example 3, penetration of 4 μm was observed in Example 4, and penetration of 1 μm was observed in Example 5. In all cases, the penetrated amount was 9 μm or less and within the limit of the penetrated amount according to the present invention, and showed favorable results.

Comparative Examples 1 and 2 and Examples 6 to 8 respectively correspond to (a) to (e) of FIG. 2B. Penetration of 10 μm was observed in Comparative Example 1, and penetration of 12 μm was observed in Comparative Example 2. In both cases, the penetrated amount exceeded 9 μm and exceeded the limit of the penetrated amount according to the present invention. Both cases showed inferior results. The cause of this is considered to be because the Ni content did not achieve the amount of 50 μm/dm² or more according to the present invention.

Meanwhile, penetration of 5 μm was observed in Example 6, penetration of 5 μm was observed in Example 7, and penetration of 2 μm was observed in Example 8. In all cases, the penetrated amount was 9 μm or less and within the limit of the penetrated amount according to the present invention, and showed favorable results.

Comparative Examples 3 to 7 respectively correspond to (a) to (e) of FIG. 2C. Penetration of 15 μm was observed in Comparative Example 3, and penetration of 10 μm was observed in Comparative Examples 4 to 7. In all cases, the penetrated amount exceeded 9 μm and exceeded the limit of the penetrated amount according to the present invention. All cases showed inferior results.

The cause of this is considered to be because the Ni ratio in the Zn—Ni alloy did not achieve the ratio of 0.16 according to the present invention. As shown in FIG. 2C, the penetration width (μm) of the edge part on both sides of the circuit caused by the soft etching solution containing 10 wt % of $H_2SO_4$ and 2 wt % of $H_2O_2$ is 10 μm or more, and the circuit was extremely susceptible to corrosion.

The foregoing results are shown in FIG. 3. In FIG. 3, many of the foregoing Examples and Comparative Examples are listed for easy of reference. In FIG. 3, although the resistance to hydrochloric acid deterioration exceeding 20% is displayed with a heavy line at the mark where the total zinc-nickel coating weight is 500 μg/dm$^2$, this does not show the restraining line of the present invention. As needed, the total zinc-nickel coating weight may exceed the foregoing restraining line and be set to 650 μg/dm$^2$. The penetration width can be reduced even if the total amount exceeds this restraining line.

Figure 4:
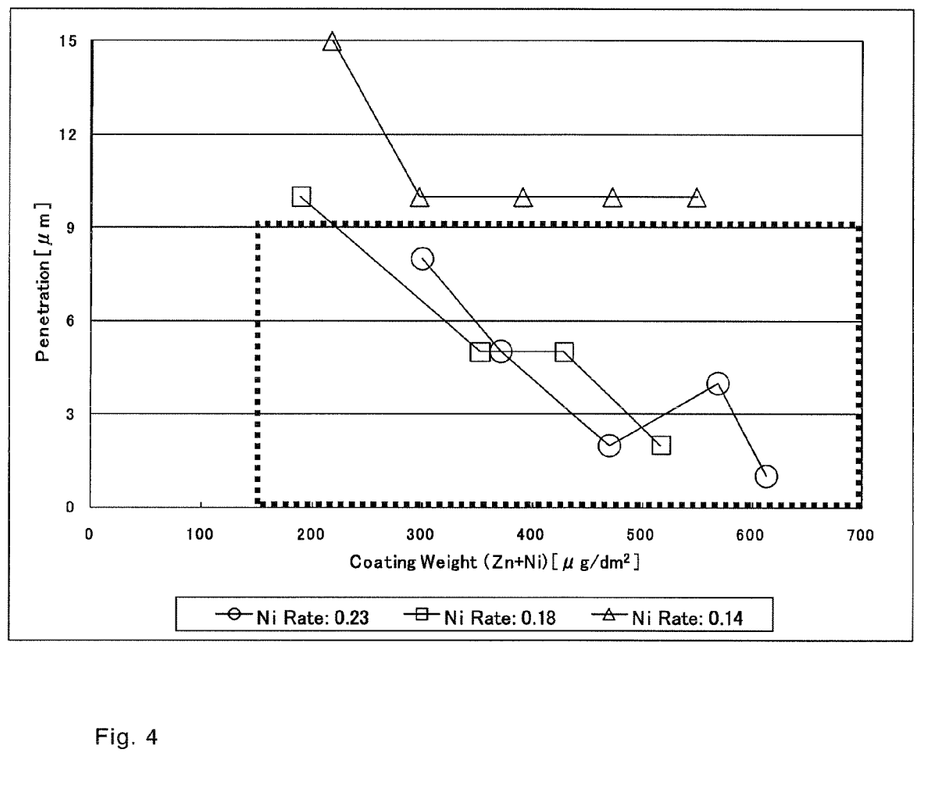
[FIG. 4] A diagram showing the relation of the penetrated amount and the zinc-nickel alloy coating weight.

The relation between the penetrated amount and the total zinc-nickel coating weight is shown in FIG. 4. FIG. 4 shows that the penetrated amount decreases pursuant to the increase in the total zinc-nickel coating weight. The increase in the total zinc-nickel coating weight means that the nickel content will also increase, and the penetrated amount consequently decreases.

Examples 9 to 12

Subsequently, examples of increasing the nickel ratio without hardly changing the zinc content are shown below.

Example 9

Deposited mass of Zn—Ni alloy: 394 μg/dm$^2$, Ni ratio: 0.40, provided that the Ni content is 159 μg/dm$^2$ Example 10

Deposited mass of Zn—Ni alloy: 344 μg/dm$^2$, Ni ratio: 0.34, provided that the Ni content is 118 μg/dm$^2$ Example 11

Deposited mass of Zn—Ni alloy: 307 μg/dm$^2$, Ni ratio: 0.29, provided that the Ni content is 89 μg/dm$^2$ Example 12

Figure 5:
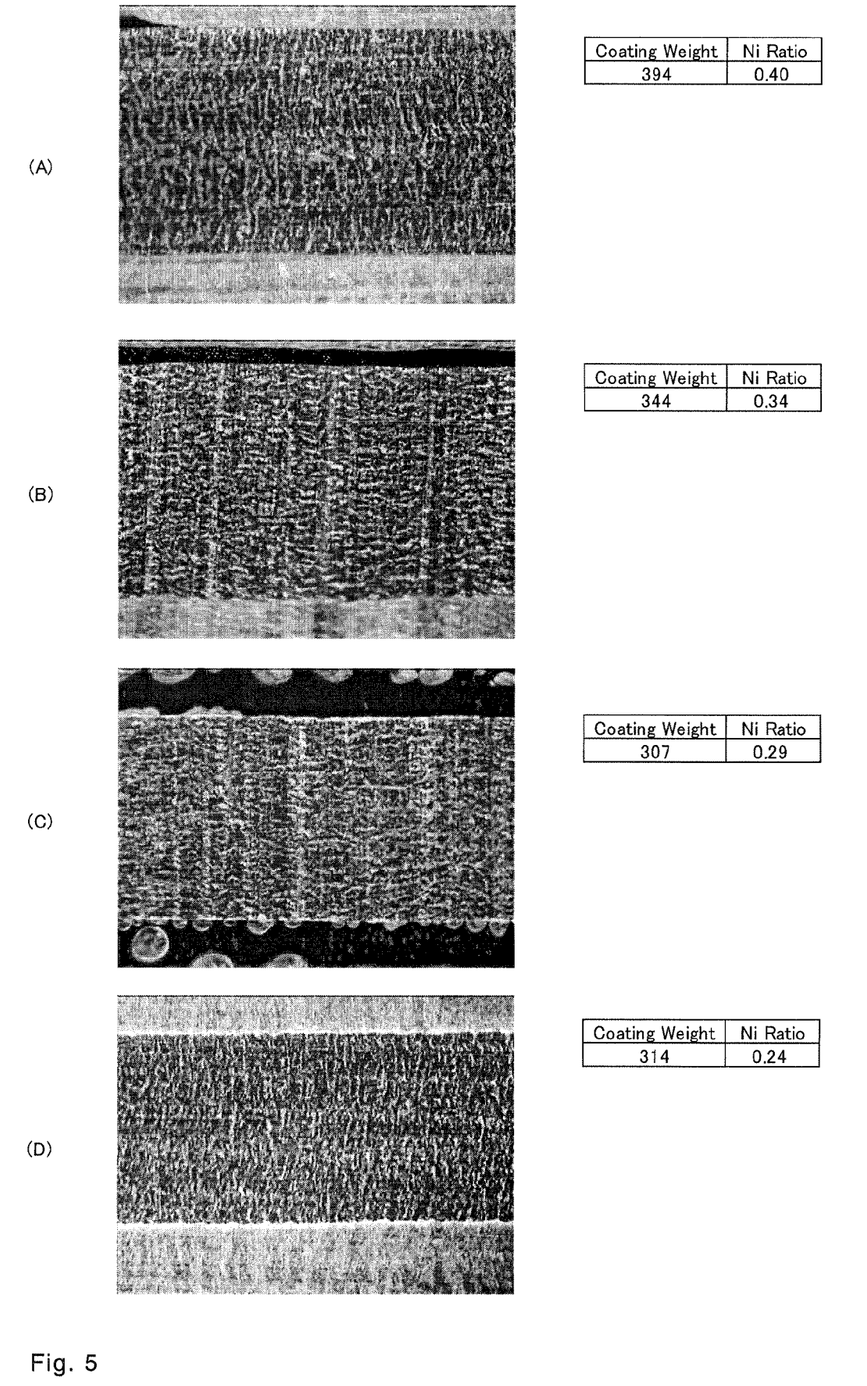
[FIG. 5] A diagram showing the results of observation on the penetrated amount in the circuit of copper-clad laminates prepared under the conditions of Examples 9 to 12.
Figure 6:
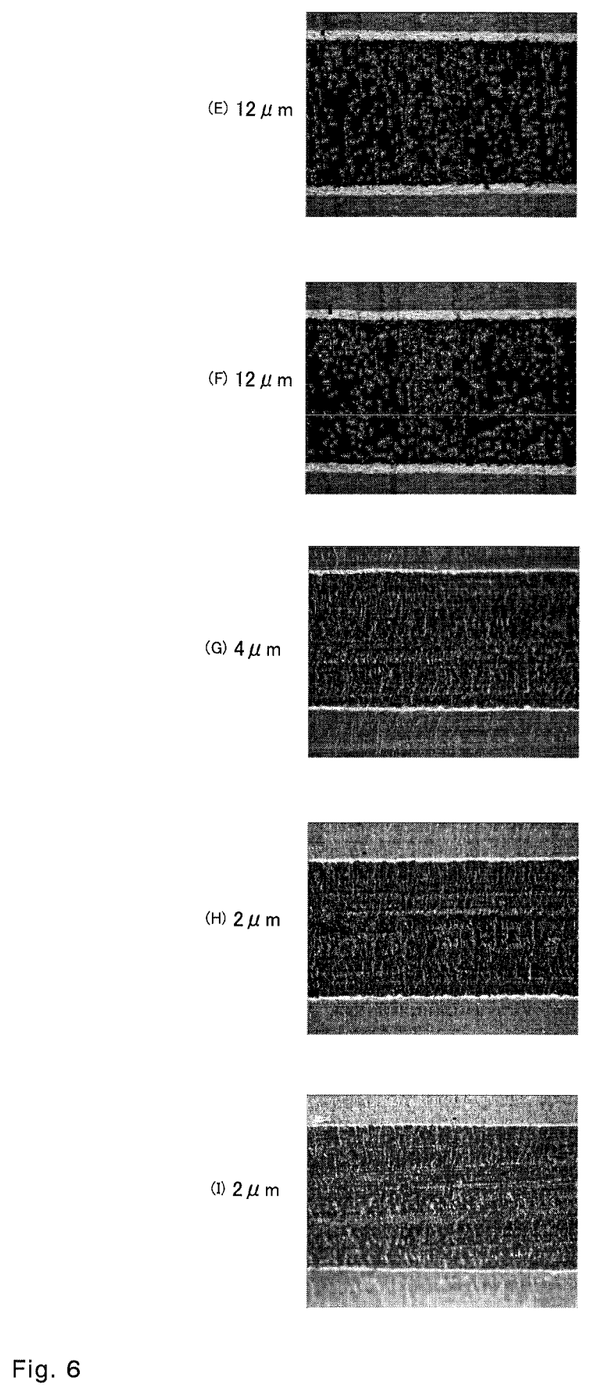
[FIG. 6] A diagram showing the results of observation on the penetrated amount in the circuit of copper-clad laminates prepared under the conditions of Comparative Example 8 (E), Comparative Example 9 (F) and Examples 13 (G) to 15 (I).

Deposited mass of Zn—Ni alloy: 314 μg/dm$^2$, Ni ratio: 0.24, provided that the Ni content is 66 μg/dm$^2$ With respect to the foregoing results, the penetration width after the soft etching was similarly observed. The results are shown in FIG. 5. FIG. 5 (A) corresponds to Example 9, (B) corresponds to Example 10, (C) corresponds to Example 11, and (D) corresponds to Example 12, respectively.

In Example 12 (D), the Ni ratio is 0.24, and only an extremely slight penetration width can be observed. However, when the Ni ratio increases as in Example 11 (C) where the Ni ratio is 0.29, in Example 10 (B) where the Ni ratio is 0.34, and in Example 9 (A) where Ni ratio is 0.40; it is evident that the penetration is disappearing. This shows that the penetration can be reduced significantly by increasing the nickel ratio.

With respect to foregoing Examples 1 to 12, normal (room temperature) peeling strength (kg/cm) and resistance to thermal deterioration were checked. The resistance to thermal deterioration is a result of checking the deterioration ratio (%) of the peeling strength after heating at 180° C.×48 hours. The resistance to hydrochloric acid deterioration is a result of measuring the peeling strength after immersing 10-line circuits having a width of 0.2 mm in 18% hydrochloric acid for 1 hour.

Moreover, the etching state in alkali etching was visually observed using the following solution. The copper foil for printed circuit according to the present invention comprising a roughened layer on a surface of a copper foil by way of copper-cobalt-nickel alloy plating, a cobalt-nickel alloy plated layer formed on the roughened layer, and a zinc-nickel alloy plated layer formed on the cobalt-nickel alloy plated layer; wherein the total amount of the zinc-nickel alloy plated layer is 150 to 650 μg/dm$^2$, the lower limit of the nickel ratio in the alloy layer is 0.16, the upper limit thereof is 0.40, and the nickel content is 50 μg/dm$^2$ or more. As a result of the observation, the copper foil for printed circuit possessed normal peeling strength that is comparable to a conventional copper foil in which the zinc content is 200 μg/dm$^2$ or less, and also possesses thermal peeling resistance and chemical resistance.

(Alkali Etching Solution)
  $NH_4OH$: 6 moles/liter
  $NH_4Cl$: 5 moles/liter
  $CuCl_2.2H_2O$: 2 moles/liter
  Temperature: 50° C.

The etching stain was visually observed by using the following copper chloride-hydrochloric acid solution.
(Copper Chloride Etching Solution)
  $CuCl_2.2H_2O$: 200 g/liter
  HCl: 150 g/liter
  Temperature: 40° C.

Comparative Examples 8 and 9

With the Zn—Ni alloy plating conditions being the same as the foregoing Examples, examples of changing only the Zn content and the Ni content are shown in Comparative Example 8 and Comparative Example 9. In the foregoing cases, the Ni ratio with respect to the total Zn—Ni alloy coating weight was 0.22.

Comparative Example 8

Zn content: 114 μg/dm$^2$, Ni content: 33 μg/dm$^2$

Comparative Example 9

Zn content: 152 μg/dm$^2$, Ni content: 44 μg/d m$^2$

As described above, although the Ni ratio of Comparative Example 8 is within the scope of the present invention, the total Zn—Ni alloy coating weight and the Ni content deviate from the scope of the present invention. Thus, the penetrated amount was inferior at 12 μm. Moreover, although the Ni ratio and the total Zn—Ni alloy coating weight of Comparative Example 9 are within the scope of the present invention, the Ni content deviates from the scope of the present invention.

Thus, the penetrated amount was inferior at 12 μm. The results are shown in FIG. 3 and FIG. 7. Incidentally, FIG. 7 (E) shows the results of observation on the penetrated amount in the circuit of Comparative Example 8, and (F) shows the foregoing results of Comparative Example 9. The acid resistance (resistance ratio to hydrochloric acid deterioration) in the foregoing cases was 3.6 in Comparative Example 8 and 3.7 in Comparative Example 9, and there was no problem with respect to the resistance ratio to hydrochloric acid deterioration.

Examples 13, 14 and 15

With the Zn—Ni alloy plating conditions being the same as the foregoing Examples, examples of changing only the Zn content and the Ni content as follows are shown in Example 13 to Example 15. In the foregoing cases, the Ni ratio with respect to the total Zn—Ni alloy coating weight was 0.22.

Example 13

Zn content: 212 μg/dm$^2$, Ni content: 61 μg/dm$^2$

Example 14

Zn content: 238 μg/dm$^2$, Ni content: 69 μg/dm$^2$

Example 15

Zn content: 273 μg/dm$^2$, Ni content: 79 μg/dm$^2$

As described above, the total Zn—Ni alloy coating weight, Ni content, and Ni ratio of Example 13 to Example 15 are all within the scope of the present invention. Consequently, the penetrated amount was 4 μm in Example 13, and 2 μm in Example 14 and Example 15, and all showed favorable results.

The results are similarly shown in FIG. 3 and FIG. 7. FIG. 7 (G) shows the results of observation on the penetrated amount in the circuit of Example 13, (H) shows the foregoing results of Example 14, and (I) shows the foregoing results of Example 15. The acid resistance (resistance ratio to hydrochloric acid deterioration) in the foregoing cases was 3.7 in Example 13, 5.0 in Example 14 and 3.6 in Example 15, and there was no problem with respect to the resistance ratio to hydrochloric acid deterioration.

As described above, the present invention provides a copper foil for printed circuit comprising a roughened layer on a surface of a copper foil by way of copper-cobalt-nickel alloy plating, a cobalt-nickel alloy plated layer formed on the roughened layer, and a zinc-nickel alloy plated layer formed on the cobalt-nickel alloy plated layer; wherein the total amount of the zinc-nickel alloy plated layer is 150 to 650 μg/dm$^2$, the lower limit of the nickel ratio in the alloy layer is 0.16, the upper limit thereof is 0.40, and the nickel content is 50 μg/dm$^2$ or more. It is evident that this copper foil for printed circuit is able to inhibit the penetration during the soft etching process, and is particularly effective when used to form a laminate (copper-clad laminate) by performing thermocompression bonding to a bilayer of resin and copper foil under high temperature and pressure.

The treatments performed during the manufacture of the printed circuits are based on even higher temperatures, and heat is generated during the use of devices after productization. Even under these circumstances, the present invention yields superior effects of being able to effectively prevent the penetration and discoloration of the circuit edge part when performing soft etching to the copper foil circuit without deteriorating the adhesive strength between the copper foil and the resin base material. Thus, the present invention is effective as a printed-circuit material for electronic equipment in which the miniaturization and high integration of semiconductor devices are being advanced.

The invention claimed is:

1. A copper foil for printed circuits, comprising a copper foil, a plated roughened layer of a copper-cobalt-nickel alloy formed on a surface of the copper foil, a plated layer of a cobalt-nickel alloy formed on the plated roughened layer, and a plated layer of a zinc-nickel alloy formed on the plated layer of the cobalt-nickel alloy; wherein the plated layer of the zinc-nickel alloy has a nickel content of 50 μg/dm$^2$ or more, and a total amount of deposited zinc and nickel, M, and a nickel ratio, N, of the plated zinc-nickel alloy are in an area of a two dimensional coordinate space of M (μg/dm$^2$) as a vertical axis and N as horizontal axis, the area being defined by lines N=0.16, N=0.40, M=500, and a polygonal line connecting coordinate points of the coordinate space, A(0.16, 500), B(0.17, 400), C(0.18, 300), P(0.22, 273) Q(0.29, 307), R(0.34, 344) and S(0.40, 394).

2. The copper foil for printed circuit according to claim 1, wherein the penetrated amount into the edge part of the copper foil circuit is 9 μm or less when performing soft etching with an etching aqueous solution containing 10 wt % of $H_2SO_4$ and 2 wt % of $H_2O_2$ to a copper foil circuit formed on a substrate by using the copper foil for printed circuit.

3. The copper foil for printed circuit according to claim 2, wherein the penetrated amount is 5 μm or less.

4. The copper foil for printed circuit according to claim 2, further comprising a rust-proof layer on the zinc-nickel alloy plated layer.

5. The copper foil for printed circuit according to claim 4, wherein the rust-proof layer is a single metal coating layer of chromium oxide or a composite alloy coating layer of chromium oxide and zinc and/or zinc oxide.

6. The copper foil for printed circuit according to claim 5, further comprising a silane coupling layer on the rust-proof layer.

7. The copper foil for printed circuit according to claim 4, wherein each deposited mass at the roughened layer is copper: 15 to 40 mg/dm$^2$, cobalt: 100 to 3000 μg/dm$^2$ and nickel: 100 to 1000 μg/dm$^2$.

8. The copper foil for printed circuit according to claim 7, wherein the cobalt-nickel alloy plated layer has a deposited mass of cobalt within a range of 200 to 3000 μg/dm$^2$ and a cobalt ratio of 60 to 66 mass %.

9. A copper-clad laminate obtained by bonding the copper foil for printed circuit according to claim 8 to a resin substrate by way of thermocompression without using an adhesive.

10. The copper foil for printed circuit according to claim 1, further comprising a rust-proof layer on the zinc-nickel alloy plated layer.

11. The copper foil for printed circuit according to claim 10, wherein the rust-proof layer is a single metal coating layer of chromium oxide or a composite alloy coating layer of chromium oxide and at least one of zinc and zinc oxide.

12. The copper foil for printed circuit according to claim 11, further comprising a silane coupling layer on the rust-proof layer.

13. The copper foil for printed circuit according to claim 1, wherein each deposited mass at the roughened layer is copper: 15 to 40 mg/dm$^2$, cobalt: 100 to 3000 μg/dm$^2$ and nickel: 100 to 1000 μg/dm$^2$.

14. The copper foil for printed circuit claim 1, wherein the cobalt-nickel alloy plated layer has a deposited mass of cobalt within a range of 200 to 3000 µg/dm$^2$ and a cobalt ratio of 60 to 66 mass %.

15. A copper-clad laminate obtained by bonding the copper foil for printed circuit according to claim 1 to a resin substrate by way of thermocompression without using an adhesive.

16. The copper foil for printed circuits according to claim 1, wherein a total amount of deposited mass of cobalt within the plated roughened layer of the copper-cobalt-nickel alloy, the plated layer of the cobalt-nickel alloy, and the plated layer of the zinc-nickel alloy is 300 to 5000 µg/dm$^2$.

17. The copper foil for printed circuits according to claim 16, wherein a total amount of deposited mass of nickel within the plated roughened layer of the copper-cobalt-nickel alloy, the plated layer of the cobalt-nickel alloy, and the plated layer of the zinc-nickel alloy is 260 to 1200 µg/dm$^2$.

18. The copper foil for printed circuits according to claim 1, wherein a total amount of deposited mass of nickel within the plated roughened layer of the copper-cobalt-nickel alloy, the plated layer of the cobalt-nickel alloy, and the plated layer of the zinc-nickel alloy is 260 to 1200 µg /dm$^2$.

19. A copper foil for printed circuits, comprising:
a copper foil;
a plated roughened layer of a copper-cobalt-nickel alloy formed on a surface of the copper foil;
a plated layer of a cobalt-nickel alloy formed on the plated roughened layer; and
a plated layer of a zinc-nickel alloy formed on the plated layer of the cobalt-nickel alloy;
wherein a total amount of deposited cobalt in the plated roughened layer of the copper-cobalt-nickel alloy and the plated layer of the cobalt-nickel alloy and the plated layer of the zinc-nickel alloy is 300 to 2800 µg/dm$^2$;
wherein a total amount of zinc content and nickel content in the plated layer of the zinc-nickel alloy is within a range of 150 to 500 µg/dm$^2$;
wherein the nickel content in the plated layer of the zinc-nickel alloy is 50 µg/dm$^2$ or more; and
wherein a total amount of deposited zinc and nickel, M, and a nickel ratio, N, of the plated layer of the zinc-nickel alloy are in an area of a two dimensional coordinate space of M (µg/dm$^2$) as a vertical axis and N as horizontal axis, the area being defined by lines N=0.16, N=0.40, M=500, and a polygonal line connecting coordinate points of the coordinate space, A(0.16, 500), B(0.17, 400), C(0.18,300), P(0.22, 273) Q(0.29, 307), R(0.34, 344) and S(0.40, 394).

20. A copper foil for printed circuits, comprising:
a copper foil;
a plated roughened layer of a copper-cobalt-nickel alloy formed on a surface of the copper foil;
a plated layer of a cobalt-nickel alloy formed on the plated roughened layer; and
a plated layer of a zinc-nickel alloy formed on the plated layer of the cobalt-nickel alloy;
wherein a ratio of cobalt with the plated layer of the cobalt-nickel alloy is 60 to 66 mass %;
wherein a total amount of zinc content and nickel content in the plated layer of the zinc-nickel alloy is within a range of 150 to 500 µg/dm$^2$;
wherein the nickel content in the plated layer of the zinc-nickel alloy is 50 µg/dm$^2$ or more; and
wherein a total amount of deposited zinc and nickel, M, and a nickel ratio N, of the plated zinc-nickel alloy are in an area of a two dimensional coordinate space of M (µg/dm$^2$) as a vertical axis and N as horizontal axis, the area being defined by lines N=0.16, N=0.40, M=500, and a polygonal line connecting coordinate points of the coordinate space, A(0.16, 500), B(0.17, 400), C(0.18,300), P(0.22, 273) Q(0.29, 307), R(0.34, 344) and S(0.40, 394).

* * * * *